United States Patent [19]
Fork et al.

[11] Patent Number: 6,121,983
[45] Date of Patent: Sep. 19, 2000

[54] METHOD AND APPARATUS FOR A SOLID STATE LASER SCANNING ARCHITECTURE

[75] Inventors: David K. Fork, Los Altos; G. A. Neville Connell, Cupertino; Eric Peeters, Fremont, all of Calif.; Robert L. Thornton, Lake Oswego, Oreg.; Patrick Y. Maeda, Mountain View, Calif.; Ross D. Bringans, Cupertino, Calif.; Thomas L. Paoli, Los Altos, Calif.; Joel A. Kubby, Rochester, N.Y.; Decai Sun; Philip D. Floyd, both of Sunnyvale, Calif.

[73] Assignee: Xerox Corporation, Stamford, Conn.

[21] Appl. No.: 09/196,396

[22] Filed: Nov. 19, 1998

[51] Int. Cl.⁷ .................................................. G03G 15/04
[52] U.S. Cl. ......................... 347/134; 347/243; 359/224
[58] Field of Search .................................. 347/130, 134, 347/238, 243; 359/201, 204, 224

[56] References Cited

U.S. PATENT DOCUMENTS

| | | | |
|---|---|---|---|
| 4,652,928 | 3/1987 | Endo et al. ........................ | 358/213 |
| 5,485,289 | 1/1996 | Curry ................................. | 358/448 |
| 5,521,748 | 5/1996 | Sarraf ................................ | 359/321 |
| 5,808,656 | 9/1998 | Goldmann ......................... | 347/238 |

OTHER PUBLICATIONS

Brosens, P.J. "Dynamic Mirror Distortions in Optical Scanning", *Applied Optics*, vol. 11, No. 12, Dec. 1972, pp. 2987–2989.

Miyajima, H.; Yamamoto, E.; Yanagisawa, K. "Optical Micro Encoder Using A Twin–Beam VCSEL with Integrated Microlenses", *Transducers '97, 1997 International Conference on Solid–State Sensors and Actuators*, Chicago, Jun. 16–19, 1997, pp. 1233–1236.

Curry, D.N. "Hyperacuity laser imager." *Journal of Electronic Imaging*. Apr. 1993, vol. 2(2), pp. 138–146.

*Primary Examiner*—Joan Pendegrass

[57] ABSTRACT

A solid state laser array is multiplexed using an array of micromirrors to permit high resolution printing in a wide format. Each laser in the laser array and each micromirror in the mirror array is individually controlled. The laser array may be an array of VCSELs produced on a GaAs substrate.

20 Claims, 7 Drawing Sheets

METHOD AND APPARATUS FOR A SOLID STATE LASER SCANNING ARCHITECTURE

FIELD OF INVENTION

The present invention relates generally to the field of optical imaging. More specifically, the present invention relates to a xerographic exposure system for printing that incorporates an array of laser sources irradiating an array of micromechanical mirrors to image a uniform series of spots onto a moving photoreceptor.

BACKGROUND AND SUMMARY OF INVENTION

Xerographic exposure systems are important for printing. In xerographic printing, lasers or LEDS may be used to expose tiny dots on a photoreceptor surface. The photoreceptor has the property of holding an electrical charge in the absence of light. Illumination of a spot on the photoreceptor by a laser or LED causes the loss of charge at the exposed spot. In a typical xerographic system, charge left on the photoreceptor attracts toner that is then transferred to paper which has a greater charge than the photoreceptor.

Desirable features for xerographic exposure printing systems include printing at high speed, wide format printing, high resolution addressability, elimination of moving mechanical parts, low power consumption, and low profile at the photoreceptor. The first three features are important for achieving performance comparable to offset lithography and occupy a parameter space that lies beyond the speed and width capabilities of polygon raster output scanning (ROS) print engines. Polygon ROS printers typically consist of a laser light source, a modulator, a polygon scanning beam deflector, an optical system of lenses and mirrors, a xerographic marking engine and the electronics to control the printer operation.

The remaining three features are desirable for any xerographic exposure system. Prior art devices that incorporate these features use LED (light emitting diode) or VCSEL (vertical cavity surface emitting laser) print bars requiring a large number of devices and drivers. The present invention allows a solid state laser scanning architecture which simultaneously enables high print speed (70 inches/sec or higher), high resolution (1200 spi or higher), low power (less than 1 watt), requires a very small width on the photoreceptor in the process direction (on the order of a millimeter or less), and is extendible to wide format printing by utilizing stitching and electronic tolerance correction. By multiplexing microscanners with laser sources the overall number of devices and drivers is reduced by more than an order of magnitude compared to LED print bars or VCSEL print bars. The reduction of the number of devices improves the overall prospects for yield and reliability since the number and the difficulty of contacts for the assembly is reduced.

In accordance with this invention, a linear array of lasers faces and is positioned parallel to a linear array of mirrors with the laser array tilted at an angle, $\phi$, with respect to the mirror array. The tilt angle $\phi$ is at least large enough so that the laser beams reflected from the mirror are not blocked by the laser array. This means that the tilt angle, $\phi$, must be larger than the laser divergence angle. Each laser in the array is individually driven by a waveform derived from the photoreceptor image data. The mirrors can each be deflected about an axis bisecting the mirror plane perpendicular to the array axis. The deflection, $\theta$, of each mirror is individually controlled by a sweep generator waveform. Each laser and corresponding mirror are separated by a distance, d, that is chosen to be short enough so that the laser beam directed at the mirror does not diverge onto adjacent mirrors.

In operation, each mirror scans a number of pixels on the photoreceptor. In other words, the pixels are multiplexed from a single mirror. This multiplexing allows for the reduction of the number of lasers needed to achieve the desired performance characteristics. The number of pixels multiplexed from a single mirror is determined by the mirror pitch, the magnification of the optics, and the print resolution. Additionally, the number of pixels addressable by a mirror depends on the dynamic range of the mirror. The dynamic range of the mirror is the number of individual angular locations resolvable by the scanning mirror; i.e. $2\theta_{max}/\Delta\theta$ where $\Delta\theta$ is the mirror positional accuracy.

Thus, the present invention and its embodiments provide numerous advantages including, but not limited to high print speed, high resolution, low power, low profile at the photoreceptor, and extendibility to wide format printing while reducing the overall number of devices and drivers needed as will be described in further detail below.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DETAILED DESCRIPTION

While the present invention is described in some detail below with reference to certain illustrated embodiments, it is to be understood that it is not limited to those embodiments. On the contrary, the intent is to cover all modifications, alternatives and equivalents falling within the spirit and scope of the invention as defined by the appended claims.

Figure 1A:
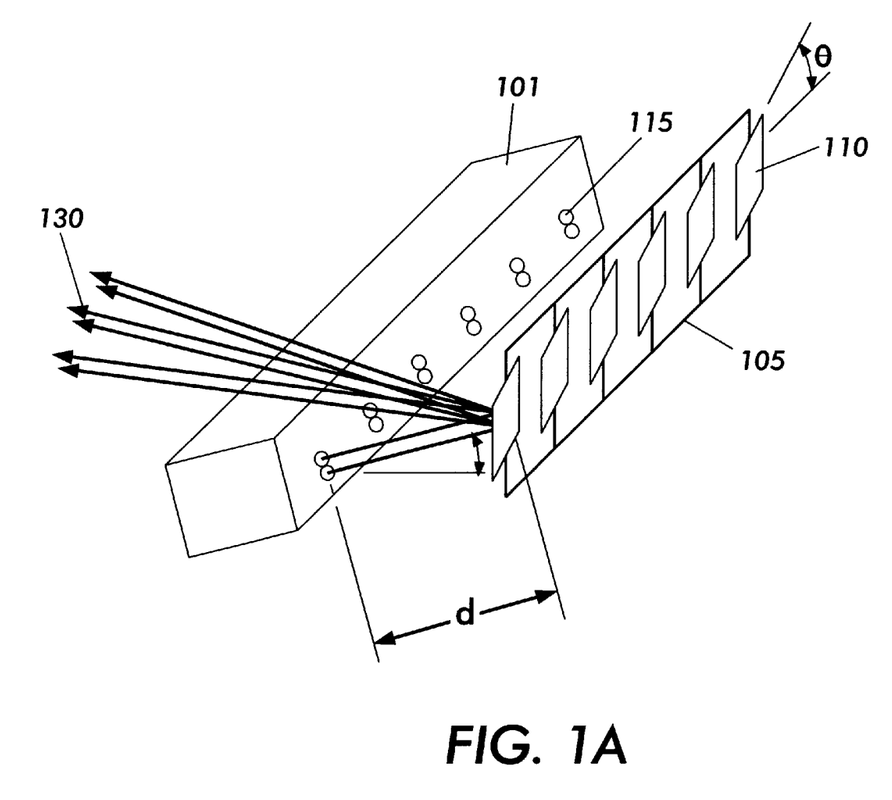
FIG. 1A is a schematic showing the arrangement of the laser and mirror arrays in the basic architecture.
Figure 1B:
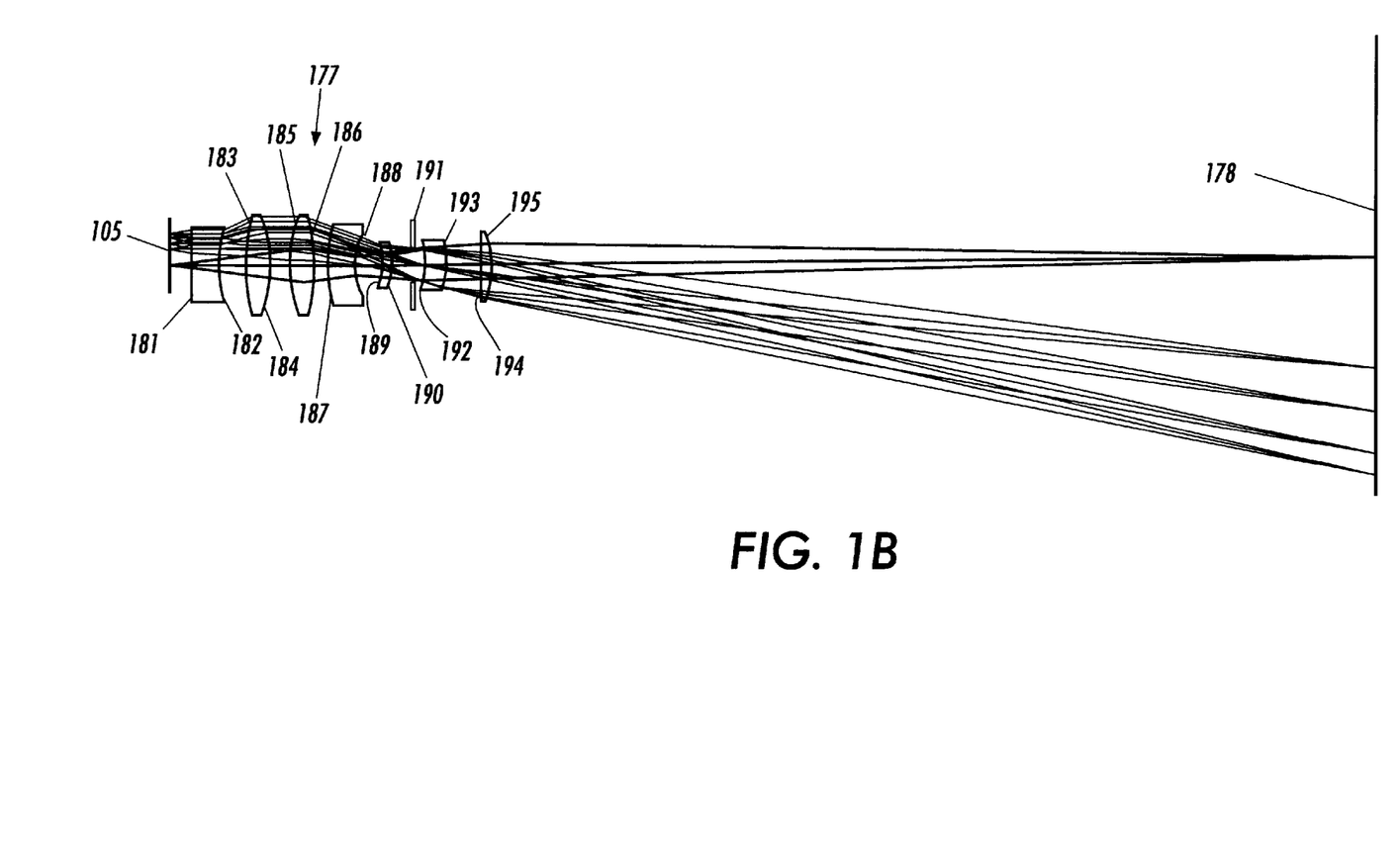
FIG. 1B is a schematic of the optical imaging system of an embodiment in accordance with the invention.

The present invention provides a solid state laser scanning architecture which simultaneously enables high print speed (70 inches/sec or higher), high resolution (1200 spi or higher), low power (less than 1 watt), low profile at the photoreceptor (on the order of a millimeter or less), and is extendible to wide format printing by utilizing stitching and electronic tolerance correction. By multiplexing microscanners with laser sources the overall number of devices and drivers is reduced by more than an order of magnitude compared to LED or VCSEL print bars. FIG. 1A. shows the geometric arrangement of laser array 101 and mirror array 105 in the basic architecture in accordance with an embodiment of this invention. Laser array 101 is tilted an angle $\phi$ with respect to mirror array 105. Tilt angle $\phi$ is at least large enough to prevent beams exiting mirrors 110 on mirror array 105 from being blocked by laser array 101. As illustrated in FIG. 1A, more than one laser 115 may be associated with each mirror 110. Each laser 115 is individually driven by a waveform derived from image data. Deflection angle $\theta$ of each mirror 110 is individually controlled by a sweep generator waveform. Laser array 101 and mirror array 105 are separated by a short distance d selected to be short enough so that laser beams 130 directed at mirrors 110 do not diverge onto adjacent mirrors. An embodiment of part of the imaging system in accordance with this invention is shown in FIG. 1B and consists of multi-element projection lens system 177 common to all mirrors 110 in mirror array 105. Multi-element projection lens system 177 relays the scanned virtual images of lasers 115 onto photoreceptor 178. Lens 181 in proximity to paired laser array 101 and mirror array 105 is also part of multi-element projection system 177. In accordance with an embodiment of the present invention, lasers 115 are vertical cavity surface emitting lasers (VCSELs) on a GaAs substrate and mirrors 110 are bulk micromachined single crystalline silicon micromirrors. The entrance pupil of multi-element projection lens system 177 is telecentric or near telecentric.

Figure 1C:
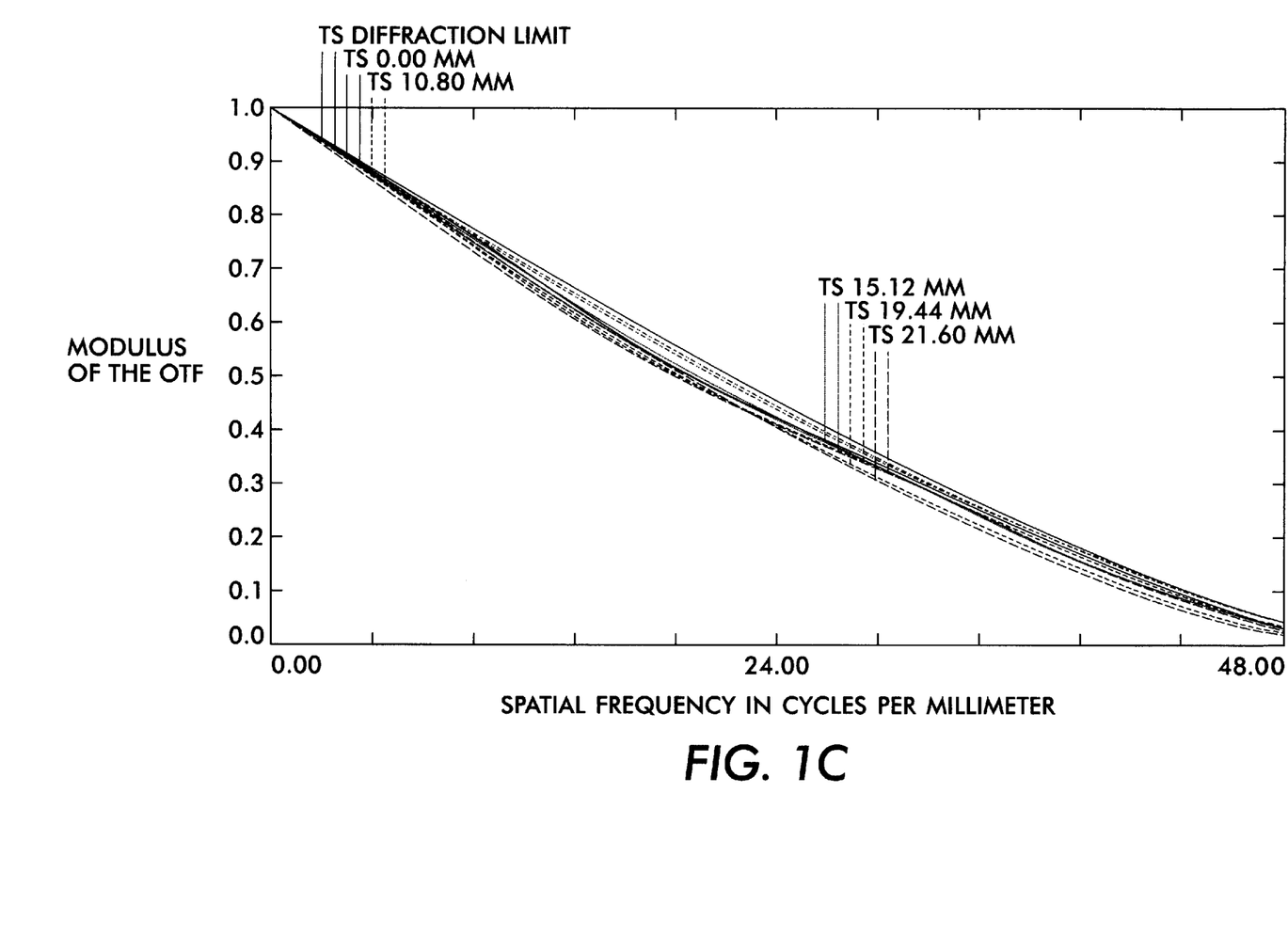
FIG. 1C shows the modulation transfer function for an embodiment of a multi-element projection lens system in accordance with the invention.

The lens prescription and layout in Table 1A describes multi-element projection lens system 177 that is suitable for producing a 1200 dpi, 12 inch, diffraction limited image of lasers 115. Focal length for multi-element projection lens system 177 is 94.4 mm with an object numerical aperture of 0.15. Glass type is indicated as a type of Schott (TM) glass available from Schott Glass Technologies, Inc. of Duryea, Pa. FIG. 1C shows the modulation transfer function for multi-element projection lens system 177.

TABLE 1A

| Surface | Radius of Curvature (mm) | Thickness (mm) | Schott (TM) Glass Type | Refractive Index ($\lambda$= 780 nm) | Minimum Diameter (mm) |
| --- | --- | --- | --- | --- | --- |
| virtual position of laser 115 | $\infty$ | 15.00000 | | | |
| lens surface 181 | $\infty$ | 20.00000 | SFL6 | 1.785615 | 51.5 |
| lens surface 182 | 89.00921 | 20.00000 | SFL6 | 1.785615 | 51.5 |
| lens surface 183 | 234.63702 | 15.00000 | LASFN31 | 1.866683 | 70.5 |
| lens surface 184 | −135.43014 | 15.00000 | LASFN31 | 1.866683 | 70.5 |
| lens surface 185 | 125.26683 | 15.00000 | LASFN31 | 1.866683 | 72.5 |
| lens surface 186 | −247.99734 | 9.99915 | LASFN31 | 1.866683 | 72.5 |
| lens surface 187 | 51.48892 | 19.94443 | SF11 | 1.765951 | 55.5 |
| lens surface 188 | 34.23177 | 20.00000 | SF11 | 1.765951 | 38.5 |
| lens surface 189 | −33.79745 | 6.533085 | SF10 | 1.712269 | 31.5 |
| lens surface 190 | −38.74422 | 14.56230 | SF10 | 1.712269 | 31.5 |
| STOP 191 | $\infty$ | 8.591075 | | | 21.4072 |
| lens surface 192 | −35.79845 | 14.44087 | SF4 | 1.738168 | 26.5 |
| fens surface 193 | −53.48233 | 3.00000 | SF4 | 1.738168 | 36.5 |
| lens surface 194 | −581.71551 | 5.15000 | SFL6 | 1.785615 | 42.5 |
| lens surface 195 | −88.64404 | 638.94819 | SFL6 | 1.785615 | 42.5 |
| Image on photoreceptor 178 | $\infty$ | | | | |

There are a number of considerations for specifying the geometry of the architecture shown in FIG. 1A. The divergence, $\alpha$, of laser 115 depends on the aperture, $\delta$, roughly obeying the expression:

$$\alpha = 4\lambda/\pi\delta \tag{1}$$

A VCSEL with an aperture of 8 microns operating at 780 nm will have a divergence of 7 degrees. The divergence, $\alpha$, sets the relation between mirror pitch, $\Lambda$, and mirror to laser distance, d. A reasonable criterion for determining the mirror to laser distance, d, is to require that the mirror is 1.5 times larger than the $1/e^2$ diameter of the beam. This criterion results in the relation:

$$\Lambda = 1.5((\delta/2)^2 + (8\lambda d/\delta\pi)^2)^{1/2} \tag{2}$$

where $\delta$ is the laser aperture.

The number of pixels multiplexed from single mirror 110 is determined by the size of the mirror, the magnification and the resolution of the optical system. Because the dynamic range of single crystalline silicon micromachined mirrors is about 1000, it is prudent to keep the number of pixels per mirror to well under 1000 in order to preserve addressability.

From FIG. 1A it is apparent that array tilt angle φ must be larger than laser divergence angle, α, so that beam 130 does not intersect laser array 101. The clearance distance, $d_c$, between the edge of diverging beam 130 and laser 115 is given by:

$$d_c = 2d \cos(\phi)\sin(\phi-\alpha)/\cos(2\phi-\alpha) \quad (3)$$

where d is mirror 110 to laser 115 distance.

Figure 2:
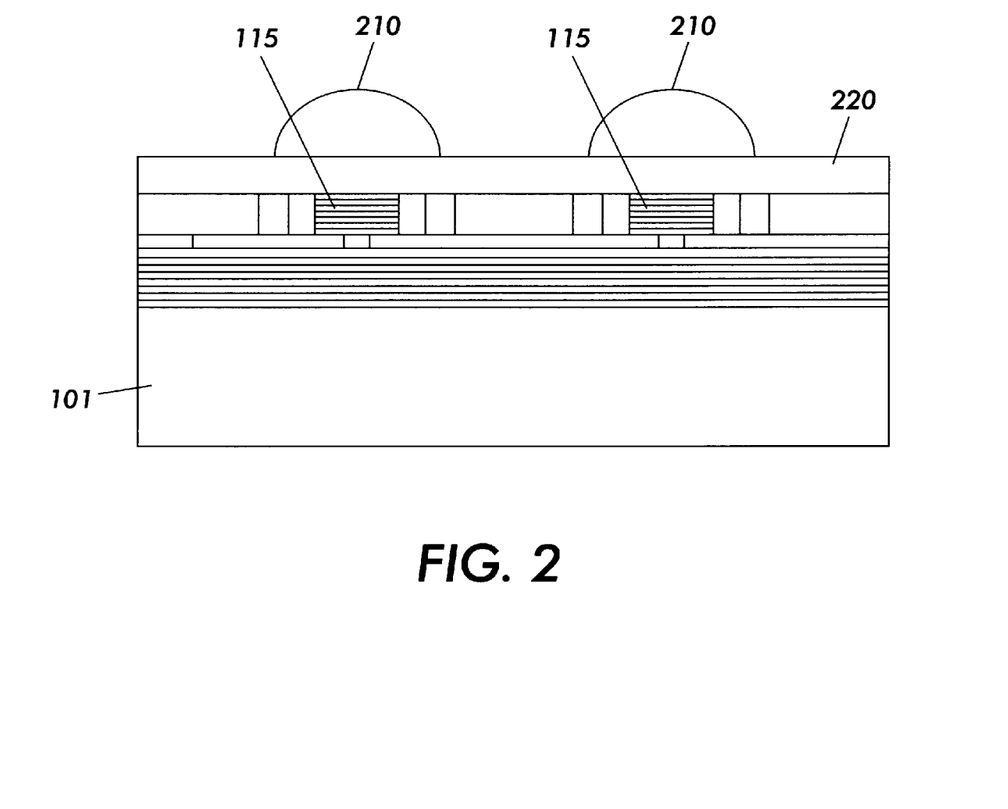
FIG. 2 shows the microlenses attached to each laser to reduce divergence in an embodiment in accordance with the invention.

It is advantageous to minimize the divergence of the laser source because this allows placement of mirrors 110 farther away from lasers 115, allowing for a larger displacement of the virtual image for a given tilt angle φ. Additionally, large divergence angles make assembly difficult by requiring shorter mirror 110 to laser 115 distance d and requires placement of lasers 115 very close to the edge of the GaAs substrate to allow clearance of beam 130 if, for example, lasers 115 are VCSELs. Numerous approaches are available to reduce VCSEL divergence, including large apertures, shorter wavelengths, and integrated microlenses. FIG. 2 shows microlenses 210 added to each laser 115 to reduce divergence. The ideal location of microlenses 210 is such that laser 115 is at the focus of microlens 210 which is accomplished by adding spacer 220. However, other modifications have been used to reduce the divergence angle as discussed by Miyajima et al. in Proc. Transducers 97, vol. 2, pp. 1233–1236 which is incorporated herein by reference in its entirety.

The design and operation of mirrors 110 is simplest when the maximum tilt angle $\phi_m$ is kept to less than ±5 degrees. Keeping tilt angle φ below ±5 degrees results in underfilling mirrors 110 no more than is necessary because underfilling shortens the distance d between laser array 101 and mirror array 105. Shortening distance d means mirrors 110 need to deflect at a greater angle to compensate.

Because an embodiment of this invention relies on having laser beams 130 with controlled divergence, keeping lasers 115 in single mode is important. Therefore, the aperture of lasers 115 should be kept to a size small enough to guarantee single mode operation. If, for example, lasers 115 are VCSELs, the aperture size is about 4 to 8 microns.

Increasing the magnification of the optical system allows reduction in the size of laser array 101 and mirror array 105. Magnification can not be increased to where the imaged spot is too large for the intended resolution of the imager. For example, if 1200 spi is the goal, then the full width at half maximum (FWHM) spot size on photoreceptor 178 must be 21 microns or less. The FWHM of the source, $a_s$, is related to the laser aperture δ by the expression:

$$a_s = (2\ln 2)^{1/2}\delta/4. \quad (4)$$

The ratio of the source spot to the image spot determines the largest magnification factor which can be used.

Figure 5A:
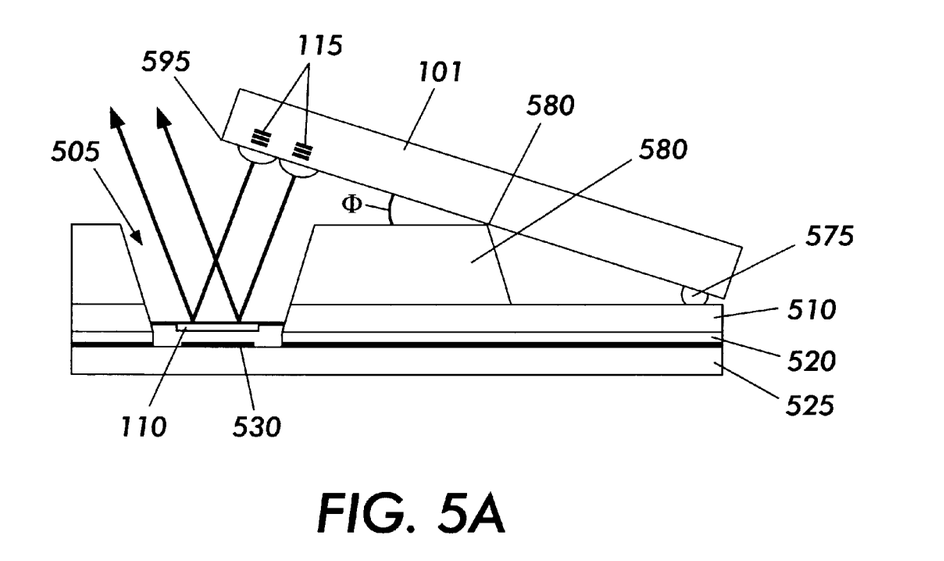
FIG. 5A shows a schematic of an embodiment in accordance with this invention of an array pair assembly.

In accordance with an embodiment of the present invention, table 1B provides parameters for a 1200 spots per inch (spi) print engine model and shows how laser array 101 and mirror array 105 can be assembled into a system. With a laser pitch of 194 microns, and a magnification of 7×, each mirror 110 scans 64 pixels on photoreceptor 178. 64 pixels is comfortably within the approximately 1000× dynamic range of mirror 110 and is also a power of two which simplifies addressing. The 194 micron pitch allows contacting lasers 115 via wirebonding to silicon driver electronics. In this architecture it is desirable to contact lasers 115 from only one side in order to provide clearance for laser beams 130 on the opposite side. Referring to FIG. 5A, the separation between laser 115 and chip edge 595 is only 47 microns in the example shown in Table 1. This is a very small separation and if lasers 115 are VCSELs in accordance with an embodiment of the present invention, this small separation raises concerns about being able to place chip edge 595 so close to lasers 115 without damaging lasers 115 when chip is cleaved. Therefore, it is very important to reduce laser beam divergence in the design of the system.

Mirrors 110 are held in place about 0.5 mm away from lasers 115 and are tilted by 10 degrees in the exemplary embodiment shown in Table 1B. Although it would appear that any tilt angle larger than about 7 degrees would work (since the VCSEL divergence half angle is 7.11 degrees), 10 degrees is optimal for the configuration in Table 1B as will be shown below.

TABLE 1B

| VSCEL + MEMS Mirror Model | |
|---|---|
| INPUTS | |
| VCSEL Wavelength | 0.78 μm |
| VCSEL Aperture | 8 μm |
| Array Tilt Angle | 9.7° |
| VCSEL Pitch | 194 μm |
| Page Width | 12 inches |
| Resolution | 1200 dpi |
| Print Speed | 70 in/sec |
| Max Magnification | 7 x |
| OUTPUTS | |
| VCSEL Divergence | 7.11° |
| Optical Magnification | 7 x |
| Emitter to Mirror Distance | 520.7 μm |
| Number of Pixels/Mirror | 64 pixels |
| Number of VCSELs | 450 VCSELs |
| Mirror Tilt (+/−) | 5.45° |
| Average Tilt/Pixel | 0.085° |
| Array Width | 43.543 mm |
| Line Time | 1.2 e-05 sec |
| Mirror Scanning Speed | 42 kHz |
| Displacement | 97 μm |
| Line Bow | 9.12 μm |
| Focus Error | 3.03 μm |
| 10% Depth of Focus | 16.87 μm |
| VCSEL to edge clearance | 47.421 μm |

Moving photoreceptor 178 at 70 in/sec requires scanning mirrors 110 at 42 kHz. For accurate motion control, the mirror frequency should be kept below the mirror resonant frequency. A model of the mirror resonant frequency predicts that with a hinge length of 100 μm and width of 15 μm, the resonant frequency would be about 226 kHz for a 10 micron thick micromirror of the dimensions 150 μm×150 μm appropriate for an embodiment in accordance with this invention.

Mirror distortion is another concern with respect to mirror motion quality. A quantitative treatment of the distortion has been published by P. J. Bosens in *Applied Optics*, 11(12), 2987, (1972) which is hereby incorporated by reference in its entirety. The distortion from planarity is calculated to be about 0.44 nm under the operating conditions given for the embodiment of Table 1B. The distortion calculations indicate that the mirror can retain its flatness to below λ/1000.

For a page-width device (12 inches wide) 225 mirrors would be needed. The mirrors could be fabricated on a single die slightly over 43.5 mm long. The die size for the GaAs semiconductor lasers is of similar length. Because it may be difficult to handle very long and narrow die (~43.5 mm), the butting together of several smaller die might be necessary. If necessary, the distance between mirrors is in a regime in which butting may be used to piece arrays together from smaller die. A 135 μm spacing of lasers 115 corresponds to having a chip density of lasers of 190 lasers per inch. The demands for butting are relaxed because the lasers are further apart than the LEDS, even for the lowest resolution LED image bars where the density is 300 SPI.

The virtual image of laser 115 lies behind mirror 110 and, as mirror 110 is deflected, the virtual image is swept in an arc on a surface of radius d centered at mirror 110. This achieves the desirable displacement in the fast scan direction of photoreceptor 178 but has the undesirable consequences of having the spot undergo bow and defocus. Expressions for the displacement, bow and defocus are given by:

$$(\text{displacement}) x = d\, \cos(\phi) \sin(2\theta) \quad (5)$$

$$(\text{bow}) y = -d\, \sin(2\phi) \sin^2(\theta) \quad (6)$$

$$(\text{defocus}) z = 2d\, \cos^2(\phi) \sin^2(\theta) \quad (7)$$

where x, y, are projected onto the surface of photoreceptor 178 and z is perpendicular to the plane defined by x and y. On photoreceptor 178, the displacement, bow, and defocus are increased by the magnification. From the above expressions (5), (6), and (7) it is clear that array tilt φ, decreases the displacement, increases the bow, and decreases the defocus.

Figure 3A:
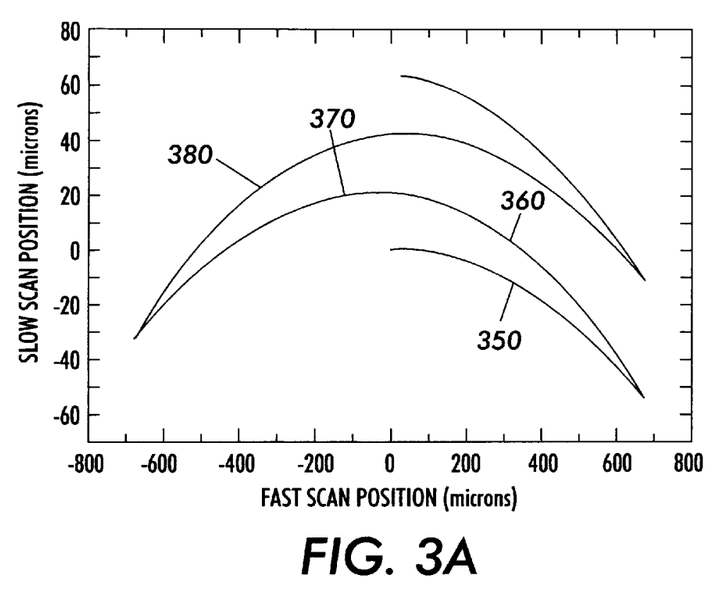
FIG. 3A shows a sweep trace for array tilt, $\phi=10$ degrees, mirror amplitude=5.45 degrees, magnification=7×, and VSCEL to array distance=520 $\mu$m in accordance with an embodiment of the invention.
Figure 3B:
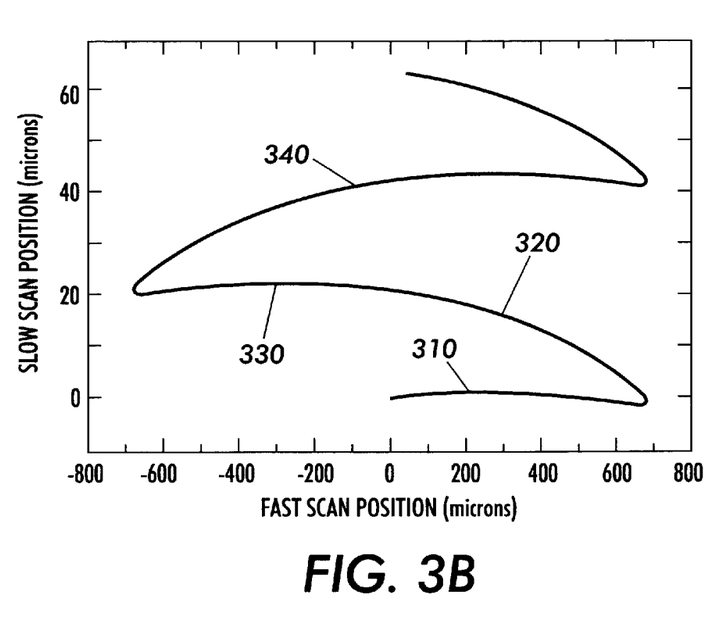
FIG. 3B shows a sweep trace for array tilt, $\phi=45$ degrees, mirror amplitude=7.64 degrees, magnification=7×, and VSCEL to array distance=520 $\mu$m in accordance with an embodiment of the invention.

The model in Table 1B shows that the bow can be on the order of the size of a pixel (1.6 microns magnified at 7×=11.2 microns which is ½ pixel at 1200 spi). Assuming that the mirror oscillates back and forth with sinusoidal variation:

$$\theta(t) = \theta_{max} \sin(\omega t + \text{phase}) \quad (8)$$

the bow is opposite the photoreceptor direction of motion part of the time, and along the photoreceptor direction of motion part of the time. If laser 115 is left on all of the time, laser 115 will trace out patterns on photoreceptor 178 like those shown in FIGS. 3A and 3B. FIG. 3B shows a sweep trace for array tilt, φ=45 degrees for comparison with FIG. 3A with an array tilt, φ=10 degrees. From FIGS. 3A and 3B it is clear that the sweep pattern on photoreceptor 178 can be excessively nonlinear. This is a major difference between the mirror scanning produced by a prior art polygon raster output scanner and digitally controlled mirrors 110. FIGS. 3A and 3B also make it clear that the degree of nonlinearity depends on whether mirror 115 is moving away from or towards the 0 micron position (the 0 micron position coincides with the 0 degree position) and also on the magnitude of the tilt angle. Array tilt angle φ was selected to be 10 degrees in the model of Table 1 so that the sweep would be nearly flat when mirror 110 is sweeping away from 0 degrees. The sweep is nearly flat for the first ¼ mirror oscillation, 310 and the third ¼ mirror oscillation, 330 because the bow is increasing at about the same rate that photoreceptor 178 is moving. Note that in FIG. 3B calculated with an array tilt angle φ of 45 degrees, the bow is larger for all segments 350, 360, 370 and 380 of the sweep and consequently the sweep is never flat.

By selecting the appropriate combination of geometry (tilt angle, d, and $\theta_{max}$) and photoreceptor speed, traces on photoreceptor 178 which are approximately flat half the time are attainable. Unfortunately, this accounts for only half of the pixels on photoreceptor 178. This problem can be overcome by having two lasers 115 shine on each mirror 110, each pair of lasers 115 offset from each other by an odd multiple of pixels in the process direction and running simultaneously. From a data buffering standpoint, it is easiest to separate lasers 115 by one pixel, however, at 1200 spi, and 7× magnification, this corresponds to a 3 micron separation which may be too small a separation but lasers 115 may be staggered. To avoid the non-linear sweeps during second quarter oscillation 320 and fourth quarter oscillation 340, both lasers 115 shining on each mirror 110 would be turned off during second quarter oscillation 320 and fourth quarter oscillation 340.

Because each mirror 110 moves approximately as a sinusoid, the sweep rate across photoreceptor 178 varies with position. The pixels must therefore be addressed in time. If N is the number of pixels to be addressed by mirror 110, the time, $t_n$, at which laser 115 fires for the first N/2 pixels is given by:

$$t_n = \frac{\tau_{line}}{\pi} \arcsin\left\{ \frac{\arcsin\left(\frac{x_n}{d\cos(\phi)}\right)}{2\theta_{max}} \right\} \quad (9)$$

where $\tau_{line}$ is the line time of the imager, $\theta_{max}$ is the maximum angular displacement of or 110 and $x_n$ is the position of the N/2 pixel.

The positions and times for a two laser per mirror embodiment are provided in Table 2 below. Table 2 shows that the time interval between laser pulses varies about 0.24 microseconds to about 0.71 microseconds. A clock running at 50 MHz or more is needed to provide the resolution in time needed to generate this firing pattern even though the average data rate is only 2.6 MHz for each laser 115. Table 2. Positions on photoreceptor 178, and firing times for the first 32 points of a laser/mirror embodiment.

TABLE 2

Positions on photoreceptor 178, and firing times for the first 32 points of a two laser/mirror embodiment.

| Point Number | $x_n(\mu m)$ | $y_n(\mu m)$ | $y_n'(\mu m)$ | $\theta_n(°)$ | $t_n$(sec) | $t_{ideal}$(sec) |
|---|---|---|---|---|---|---|
| 0 | 10.60938 | 0.102006 | 21.26867 | 0.084602 | 5.89e-08 | 1.48e-09 |
| 1 | 31.82813 | 0.290285 | 21.45695 | 0.253809 | 1.77e-07 | 1.34e-08 |
| 2 | 53.04688 | 0.457761 | 21.62443 | 0.423025 | 2.95e-07 | 3.71e-08 |
| 3 | 74.26563 | 0.604642 | 21.77131 | 0.592256 | 4.13e-07 | 7.27e-08 |
| 4 | 95.48438 | 0.731140 | 21.89781 | 0.761507 | 5.31e-07 | 1.20e-07 |
| 5 | 116.7031 | 0.837470 | 22.00414 | 0.930785 | 6.51e-07 | 1.80e-07 |
| 6 | 137.9219 | 0.923854 | 22.09052 | 1.100095 | 7.71e-07 | 2.51e-07 |

TABLE 2-continued

Positions on photoreceptor 178, and firing times for the first 32 points of a two laser/mirror embodiment.

| Point Number | $x_n(\mu m)$ | $y_n(\mu m)$ | $y_n'(\mu m)$ | $\theta_n(°)$ | $t_n(\text{sec})$ | $t_{ideal}(\text{sec})$ |
|---|---|---|---|---|---|---|
| 7  | 159.1406 | 0.990525  | 22.15719 | 1.269444 | 8.91e-07 | 3.34e-07 |
| 8  | 180.3594 | 1.037726  | 22.20439 | 1.438837 | 1.01e-06 | 4.29e-07 |
| 9  | 201.5781 | 1.065716  | 22.23238 | 1.608281 | 1.14e-06 | 5.36e-07 |
| 10 | 222.7969 | 1.074772  | 22.24144 | 1.777781 | 1.26e-06 | 6.55e-07 |
| 11 | 244.0156 | 1.065195  | 22.23186 | 1.947343 | 1.39e-06 | 7.86e-07 |
| 12 | 265.2344 | 1.037316  | 22.20398 | 2.116974 | 1.51e-06 | 9.29e-07 |
| 13 | 286.4531 | 0.991497  | 22.15719 | 1.269444 | 8.91e-07 | 3.34e-07 |
| 14 | 307.6719 | 0.928147  | 22.09481 | 2.456465 | 1.77e-06 | 1.25e-06 |
| 15 | 328.8906 | 0.847725  | 22.01439 | 2.626337 | 1.91e-06 | 1.43e-06 |
| 16 | 350.1094 | 0.750756  | 21.91742 | 2.796301 | 2.04e-06 | 1.62e-06 |
| 17 | 371.3281 | 0.637849  | 21.80452 | 2.966365 | 2.18e-06 | 1.82e-06 |
| 18 | 392.5469 | 0.509713  | 21.67638 | 3.136533 | 2.33e-06 | 2.04e-06 |
| 19 | 413.7656 | 0.367192  | 21.53386 | 3.306813 | 2.47e-06 | 2.27e-06 |
| 20 | 434.9844 | 0.211298  | 21.37796 | 3.477210 | 2.62e-06 | 2.50e-06 |
| 21 | 456.2031 | 0.043273  | 21.20994 | 3.647731 | 2.78e-06 | 2.76e-06 |
| 22 | 477.4219 | -0.13534  | 21.03133 | 3.818382 | 2.94e-06 | 3.02e-06 |
| 23 | 498.6406 | -0.32256  | 20.84410 | 3.989169 | 3.11e-06 | 3.3e-06 |
| 24 | 519.8594 | -0.51582  | 20.65084 | 4.160099 | 3.29e-06 | 3.58-e06 |
| 25 | 541.0781 | -0.71163  | 20.45503 | 4.331179 | 3.48-06  | 3.88-06 |
| 26 | 562.2969 | -0.90508  | 20.26159 | 4.502414 | 3.69e-06 | 4.20e-06 |
| 27 | 583.5156 | -1.08886  | 20.07781 | 4.673811 | 3.91e-06 | 4.52e-06 |
| 28 | 604.7344 | -1.25124  | 19.91543 | 4.845378 | 4.15e-06 | 4.86e-06 |
| 29 | 625.9531 | -1.37109  | 19.79558 | 5.01712  | 4.44e-06 | 5.21e-06 |
| 30 | 647.1719 | -1.40213  | 19.76454 | 5.189044 | 4.78e-06 | 5.57e-06 |
| 31 | 668.3906 | -1.18477  | 19.98189 | 5.361158 | 5.28e-06 | 5.94e-06 |

Figure 4:
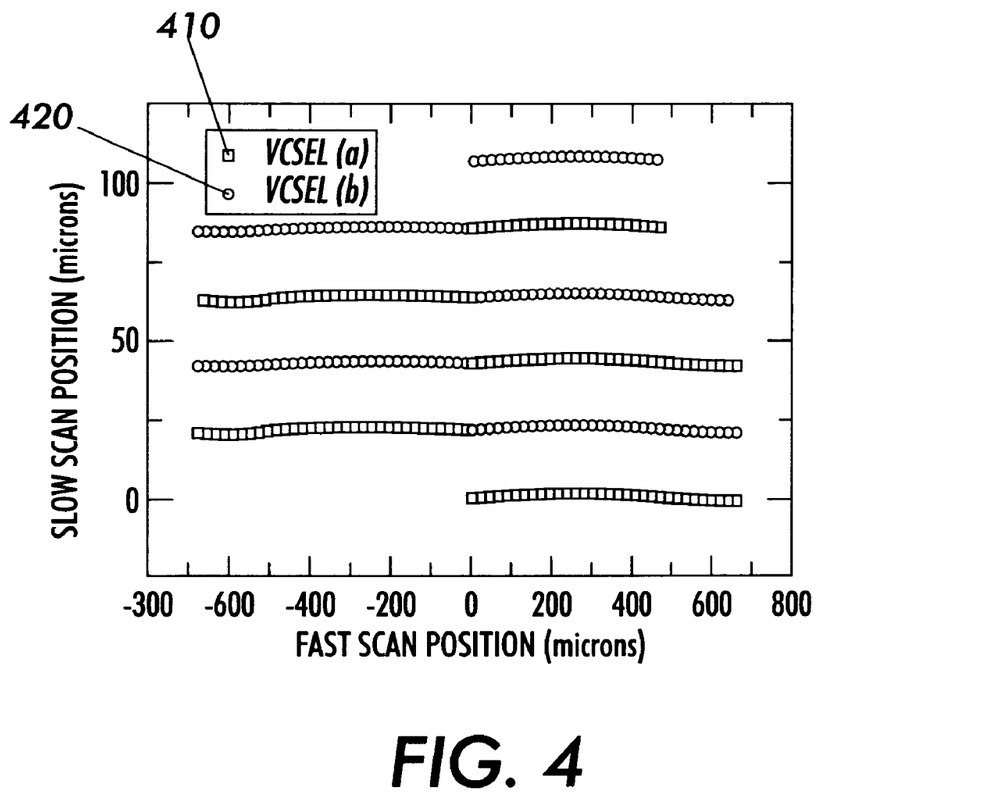
FIG. 4 shows pixel placement on the photoreceptor for optimized tilt and firing time in accordance with an embodiment of the invention.

FIG. 4 shows placement of the spots on photoreceptor 178 for the time-address scheme described above. The spot positions are calculated using the first two full oscillations of the mirror. Since two lasers 115 are used, all the required points are addressed. The bow of the line swept on photoreceptor 178 is a small fraction of one pixel. Scan lines can be generated with even less bow provided that mirrors 110 can be driven with a non-sinusoidal waveform. This is possible if mirrors 110 are operated well below their resonant frequency. The scan can be made ideally flat by driving mirror 110 so that the bow is exactly compensated by the photoreceptor movement. Exact compensation requires moving mirror 110 faster when it is close to 0 degrees, and slower near its limits, $\theta_{max}$. In an embodiment in accordance with the present invention, this requires that laser 110 firing interval is compressed to the order of a nanosecond near 0 degrees. For lower speed printing, or with less multiplexing (e.g. more lasers) exact compensation is achieved with less compressed firing intervals.

Another aspect of using a mirror scan is defocus. Therefore, it is important to compare the defocus to the overall depth of focus (DOF) of the imaging system. The embodiment in Table 1 shows that the focus error is about half of the 10% depth of focus. This is large but still within the depth of focus.

The actual assembly of lasers 115 and mirrors 110 will contain errors. Errors in the placement of lasers 115, either due to non-parallelism or butting, will shift the positions of the pixels on photoreceptor 178. Placement of lasers 115 needs to be sufficiently regular to assure finite overlap of beams 130. Lasers 115 also need to be positioned so that, once lasers 115 are magnified, spacing of the projected spots is regular to within 10 percent of pixel size. For the embodiment recited in Table 1 this value is 0.3 microns. Spot placement is also effected by mirror 110 to laser 115 spacing d according to equations 5–7 magnified through the projection lens. Application of the 10 percent of pixel size criteria implies a tolerance in d of 1.6 microns. This requirement can be relaxed based on scanner overlap. If the overlap is designed to be 4 pixels but no less than 2 pixels and if electronic correction for assembly errors is used, the acceptable tolerance for d is 32 microns which translates to about 6 percent of d. Tilt angle φ requires a tolerance of +/−0.5 degrees to meet the 10 percent of pixel size criteria.

It is fortunate that such errors can be corrected electronically. Errors in the spot placement in the process direction can be canceled out by advancing or delaying the data stream and the mirror drive waveform in tandem. Errors of spot placement in the fast scan direction can be canceled out by adding a DC offset to the mirror drive waveform. Having this flexibility in both the slow and fast scan directions is advantageous. Exploiting this flexibility requires the construction of a mirror driver for each mirror 110 to provide precise control over the amplitude, phase, and offset of each mirror 110. All drivers can be supplied by one or several application specific integrated circuits (ASICs). Another embodiment in accordance with the present invention allows mirrors 110 to be free-running and controls the firing of each of lasers 115 precisely.

The addressability in time with a given laser-mirror pair is analogous to the addressability in time in the fast scan direction for a polygon ROS. Greater control over the laser firing time results in greater spot placement control. If necessary, more addressability in the slow scan direction can be provided to embodiments in accordance with the present invention by adding more lasers 115 per mirror 110 at fractional pixel displacements and fragmenting the dataflow because of the resulting overscanning.

The optical track of the architecture of the present invention is much like any projection system in having a source, lens or lenses, and an image. In comparison to a polygon ROS, an advantage lies in the removal of the pre-polygon space, allowing for more compact printer sizes, for example.

The page width and field angle determine the optical track length. If the optical track length needs to be reduced, the projection system can be broken up into multiple path segments which are stitched together to make up the optical track. For a constant field angle, the optical track length will be reduced in proportion to the number of path segments. Providing electronic placement error correction in both the slow scan and fast scan directions on photoreceptor 178 greatly simplifies stitching. The image approaches photoreceptor 178 as a thin band of light, converging in the process direction, and diverging in the scan direction. This minimizes the area consumption on photoreceptor 178 in comparison to one to one imagers utilizing a gradient index lens because a gradient index lens is fairly wide in the process direction.

A single lens system will have an excessively long optical track length for wide body (36 inch) printing. The stitched approach provides a means for combining a small number of modular print engines to make a single wide body engine.

Laser sources 115 provide a high energy throughput since lasers 115 underfill mirrors 110 and the remaining optics as well. Assuming the throughput is about 80%, and the exposure time is approximately 50 nsec for each pixel at an energy per unit area of 7.5 erg/cm$^2$, an embodiment in accordance with the present invention requires each laser 115 to output 50 to 100 µW of power. The total peak optical power is on the order of 22 mW. The total peak power consumption of lasers 115 is then several times larger than 22 mW. Hence, embodiments in accordance with the present invention run at very low power when compared to more conventional architectures.

The assembly of an embodiment in accordance with the present invention shown in FIG. 5A requires precise control of tilt angle φ, laser to mirror registration (the position of the lasers with respect to the mirrors), and laser 115 to mirror 110 separation, d. The submillimeter spacing between lasers 115 and mirrors 110 requires silicon spacer 505. The lateral alignment between laser array 101 and mirror array 105 are realized by the self alignment force of solder bumps during reflow. Tilt angle φ is determined by the thickness of silicon spacer 505 and the distance from edge point 580 to solder bump 575 which can be defined precisely by lithography.

Figure 5B:
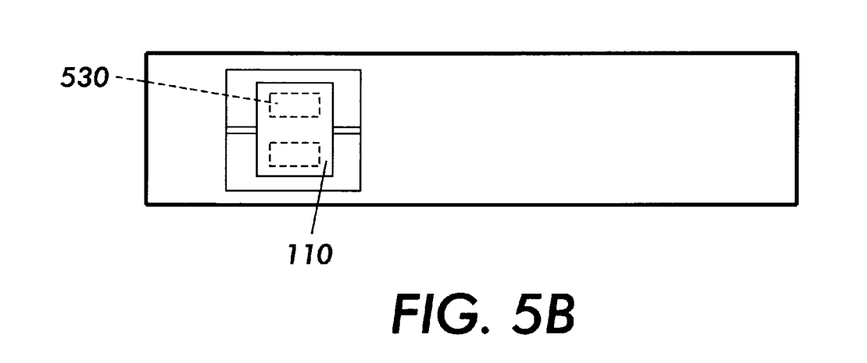
FIG. 5B shows a schematic of the mirror and driver electrodes in accordance with an embodiment of the invention.

FIG. 5A illustrates an embodiment where mirrors 110 are irradiated from lasers 115 through back-etched channels 506 in mirror substrate 510. Spacer layer 520 and electrode substrate 525 are situated below mirror array 101 to permit flexure and to apply drive voltages. Electrodes 530 which drive the mirror can also be used to sense position. FIG. 5B shows electrodes 530 and mirror 110 in top view.

Electrical contact to laser array 101 can be achieved by a number of methods. If lasers 115 are VCSELs and emit through their substrate, top contacts to lasers 115 are feasible. If lasers 115 are VCSELs and top emitting, then bump bonding, tab bonding or wire bonding may be used to contact laser array 101.

Mirrors 110 may be fabricated by surface micromachining or by bulk micro-machining. Presently, mechanical properties are better behaved for single crystal, bulk-machined devices, however, embodiments in accordance with the present invention are not limited to such implementations.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

We claim:

1. An apparatus for implementing a solid state laser scanning architecture comprising:

a plurality of lasers arranged in a first linear array;

a plurality of deflectable micromirrors arranged in a second linear array positioned substantially parallel to and tilted at an angle with respect to said first linear array; and a target surface whereby a beam emitted from one of said plurality of lasers and received by one of said plurality of deflectable mirrors is multiplexed onto a plurality of spots on said target surface.

2. The apparatus of claim 1 wherein said plurality of lasers is a plurality of vertical cavity surface emitting lasers.

3. The apparatus of claim 2 wherein each of said plurality of vertical cavity surface emitting lasers has an integrated microlens.

4. The solid apparatus of claim 1 wherein said first array and said second array are separated by a distance selected to be short enough so that said emitted beam is received by no more than said one of said plurality of micromirrors.

5. The apparatus of claim 1 wherein said plurality of deflectable micromirrors are driven by a pair of electrodes.

6. The apparatus of claim 4 wherein said pair of electrodes are used to sense the orientation of said deflectable micromirrors.

7. The apparatus of claim 1 wherein each of said plurality of lasers is individually driven by a waveform.

8. The apparatus of claim 1 wherein each of said plurality of deflectable micromirrors is independently deflectable.

9. The apparatus of claim 1 wherein said target surface is capable of motion.

10. The apparatus of claim 1 wherein said plurality of spots is substantially uniformly positioned.

11. The apparatus of claim 1 wherein said plurality of spots is a power of two in number.

12. The apparatus of claim 1 wherein said plurality of micromirrors are bulk micromachined single crystalline micromirrors.

13. A xerographic exposure system for printing, said xerographic exposure system comprising:

an array of laser sources;

an array of deflectable micromirrors positioned substantially parallel to said array of laser sources; and a moving photoreceptor disposed proximate to said array of deflectable micromirrors whereby a beam emitted from one of said laser sources and received by one of said deflectable micromirrors is multiplexed onto a plurality of spots on said moving photoreceptor.

14. The xerographic exposure system for printing of claim 13 wherein said array of laser sources comprises vertical cavity surface emitting lasers.

15. The xerographic exposure system for printing of claim 14 wherein each of said vertical cavity surface emitting lasers has an integrated microlens.

16. A method for implementing a solid state laser scanning architecture comprising:

arranging a plurality of lasers in a first linear array;

arranging a plurality of deflectable micromirrors in a second linear array positioned substantially parallel to and tilted at an angle with respect to said first linear array; and providing a target surface whereby a beam emitted from one of said plurality of lasers and received by one of said plurality of deflectable mirrors is multiplexed onto a plurality of spots on said target surface.

17. The method of claim 16 wherein said plurality of lasers is a plurality of vertical cavity surface emitting lasers.

18. The method of claim 16 wherein said target surface is capable of motion.

19. The method of claim 16 wherein said plurality of deflectable micromirrors are driven by a pair of electrodes.

20. The method of claim 16 wherein said plurality of micromirrors are bulk micromachined single crystalline micromirrors.

* * * * *

UNITED STATES PATENT AND TRADEMARK OFFICE
CERTIFICATE OF CORRECTION

PATENT NO. : 6,121,983  
APPLICATION NO. : 09/196396  
DATED : September 19, 2000  
INVENTOR(S) : David K. Fork et al.

Page 1 of 1

It is certified that error appears in the above-identified patent and that said Letters Patent is hereby corrected as shown below:

Column 1, line 3, insert as a new paragraph:

This invention was made with Government support under 70NANB8H4014 awarded by NIST. The Government has certain rights in this invention.

Signed and Sealed this

Seventeenth Day of April, 2007

JON W. DUDAS  
*Director of the United States Patent and Trademark Office*